United States Patent [19]

Lee

[11] Patent Number: 5,805,928

[45] Date of Patent: Sep. 8, 1998

[54] BURST LENGTH DETECTION CIRCUIT FOR DETECTING A BURST END TIME POINT AND GENERATING A BURST MODE SIGNAL WITHOUT USING A CONVENTIONAL BURST LENGTH DETECTION COUNTER

[75] Inventor: Jae Jin Lee, Kyoungki-do, Rep. of Korea

[73] Assignee: Hyundai Electronics Industries, Co., Ltd., Ichon, Rep. of Korea

[21] Appl. No.: 670,842

[22] Filed: Jun. 28, 1996

[30] Foreign Application Priority Data

Jun. 30, 1995 [KR] Rep. of Korea .................. 1995-18878

[51] Int. Cl.[6] .................................................. G06F 13/28
[52] U.S. Cl. .......................................... 395/855; 711/219
[58] Field of Search ............................. 365/189.05, 233, 365/233.5, 855; 711/217, 219

[56] References Cited

U.S. PATENT DOCUMENTS

| | | | |
|---|---|---|---|
| 5,268,865 | 12/1993 | Takasugi | 365/189.05 |
| 5,319,759 | 6/1994 | Chan | 711/217 |
| 5,345,573 | 9/1994 | Bowden et al. | 711/217 |
| 5,452,261 | 9/1995 | Chung et al. | 365/233 |
| 5,526,320 | 6/1996 | Zagar et al. | 365/233.5 |
| 5,675,549 | 10/1997 | Ong et al. | 365/233.5 |

*Primary Examiner*—Thomas C. Lee
*Assistant Examiner*—David Ton
*Attorney, Agent, or Firm*—Reid & Priest LLP

[57] ABSTRACT

A burst length detection circuit comprising at least two registers, each the registers storing a corresponding one of at least two external address signals therein, at least two internal address signal generators, each of the internal address signal generators inputting a corresponding one of the at least two external address signals as its initial value and sequentially incrementing it by one in response to a clock signal to sequentially generate internal address signals, at least two comparators, each of the comparators being operated in response to a control signal to compare an output signal from a corresponding one of the at least two internal address signal generators with an output signal from a corresponding one of the at least two registers, a logic circuit for performing a logic operation with respect to output signals from at least two comparators to detect a burst end time point, and a burst signal generation circuit for generating a burst mode signal with a desired logic value in response to an external burst command signal and a burst end signal from the logic circuit.

4 Claims, 6 Drawing Sheets

BURST LENGTH DETECTION CIRCUIT FOR DETECTING A BURST END TIME POINT AND GENERATING A BURST MODE SIGNAL WITHOUT USING A CONVENTIONAL BURST LENGTH DETECTION COUNTER

BACKGROUND OF THE INVENTION

1. Field of the Invention

The present invention relates in general to a burst circuit for a semiconductor memory device such as synchronous dynamic random access memory (referred to hereinafter as "synchronous DRAM"), and more particularly to a burst length detection circuit which is capable of detecting a burst end time point without the use of a burst length detection counter which is conventionally provided to determine the number of successive operation cycles.

2. Description of the Prior Art

Generally, a synchronous DRAM is operated in a burst mode to efficiently perform successive reading or writing operations. In other words, in the burst mode, the synchronous DRAM generates at least one internal address signal in response to one external input address signal to perform successive reading or writing operations, thereby enhancing the operational speed. The term "burst length" is employed to indicate the number of successive operations in the burst mode. For example, in the case where a burst length is 4 and an input address signal is $A_n$, the synchronous DRAM is operated as if it successively inputted address signals $A_n$, $A_{n+1}$, $A_{n+2}$ and $A_{n+3}$ in response to successive input clock, even though it did not actually input any external address signal.

FIG. 1 is a circuit diagram illustrating one example of a conventional burst length detection circuit. As shown in this drawing, the conventional burst length detection circuit comprises a counting circuit 20, having an initial value of 0, to count an external clock signal clk from a clock signal input line 1, a comparison circuit 30 for comparing an output signal from the counting circuit 20 with a burst length signal from a decoder (not shown), which decodes external data regarding a burst length and generating a burst end signal burst_end in accordance with the compared result, a delay circuit 10 for delaying the external clock signal clk from the clock signal input line 1 for a predetermined time period and supplying the delayed clock signal to the comparison circuit 30, and a burst signal generation circuit 40 for generating a burst mode signal burst_sig from the application of an external burst command signal cmd_sig from an input line 2 till the application of the burst end signal burst_end from the comparison circuit 30.

The counting circuit 20 includes a first counter for changing its output state at a falling edge of the external clock signal clk from the clock signal input line 1 to generate a count signal cnt_1, a second counter connected to an output terminal of the first counter for changing its output state at a falling edge of the count signal cnt_1 from the first counter to generate a count signal cnt_2, a third counter connected to an output terminal of the second counter for changing its output state at a falling edge of the count signal cnt_2 from the second counter to generate a count signal cnt_3, and a fourth counter connected to an output terminal of the third counter for changing its output state at a falling edge of the count signal cnt_3 from the third counter to generate a count signal cnt_4. Each of the first to fourth counters has the initial value of 0.

The comparison circuit 30 includes an NMOS transistor Q3 connected between nodes N2 and N3, an NMOS transistor Q5 connected between the node N2 and a node N4, an NMOS transistor Q7 connected between the node N2 and a node N5, and an NMOS transistor Q9 connected between the node N2 and a node N6. The NMOS transistor Q3 has a gate for inputting an output signal bl1 from the decoder indicating that the burst length is 1. The NMOS transistor Q5 has a gate for inputting an output signal bl2 from the decoder indicating that the burst length is 2. The NMOS transistor Q7 has a gate for inputting an output signal bl4 from the decoder indicating that the burst length is 4. Finally, the NMOS transistor Q9 has a gate for inputting an output signal bl8 from the decoder indicating that the burst length is 8.

The comparison circuit 30 also includes an NMOS transistor Q4 connected between the node N3 and a ground voltage sourcgwVss, an NMOS transistor Q6 connected between the node N4 and the ground voltage source Vss, an NMOS transistor Q8 connected between the node N5 and the ground voltage source Vss, and an NMOS transistor Q10 connected between the node N6 and the ground voltage source Vss. The NMOS transistor Q4 has a gate for inputting the count signal cnt_1 from the first counter. The NMOS transistor Q6 has a gate for inputting the count signal cnt_2 from the second counter. The NMOS transistor Q8 has a gate for inputting the count signal cnt_3 from the third counter. Finally, the NMOS transistor Q10 has its gate for inputting the count signal cnt_4 from the fourth counter.

Furthermore, the comparison circuit 30 includes a PMOS transistor Q1 connected between a supply voltage source Vdd and a node N1, an NMOS transistor Q2 connected between the nodes N1 and N2, and an invertor 31 connected between the node N1 and the burst signal generation circuit 40. The PMOS transistor Q1 and the NMOS transistor Q2 have gates for commonly inputting an output signal clk_d from the delay circuit 10.

The burst signal generation circuit 40 includes an invertor 41 for inverting the external burst command signal cmd_sig from the input line 2, a PMOS transistor Q11 connected between the supply voltage source Vdd and an output node N7, and an NMOS transistor Q12 connected between the output node N7 and the ground voltage source Vss. The PMOS transistor Q11 has a gate for inputting an output signal from the invertor 41. In addition, the NMOS transistor Q12 has its gate for inputting the burst end signal burst_end from the comparison circuit 30.

The operation of the conventional burst length detection circuit with the above-mentioned construction will hereinafter be described with reference to FIG. 2.

FIGS. 2 is a timing diagram illustrating the operation of the conventional burst length detection circuit. For example, in a case where the decoder decodes external data indicating that the burst length is 4, and outputs the decoded signal to the comparison circuit 30, a high level signal is applied to the gate of the NMOS transistor Q7, and low level signals are applied to the gates of the NMOS transistors Q3, Q5 and Q9. As a result, the NMOS transistor Q7 is turned on and the NMOS transistors Q3, Q5 and Q9 are turned off. At this time, as shown in (C) of FIG. 2, if the external burst command signal cmd_sig from the input line 2 is inverted by the invertor 41 and applied to the gate of the PMOS transistor Q11, the PMOS transistor Q11 is turned on, thereby causing an output line 42 connected to the node N7 to reach a high level. As a result, the burst mode signal burst_sig as shown in (F) of FIG. 2 is generated to allow the present state to enter a burst mode. Also, as shown in (A) of FIG. 2, the delay circuit 10 delays the external clock signal clk from the clock signal input line 1 for the predetermined time period and supplies the delayed clock signal clk_d, as shown in (B) of FIG. 2, to the comparison circuit 30. When the delayed clock signal clk_d from the delay circuit 10 is on a high level, the NMOS transistor Q2 in the comparison circuit 30 is turned on. As a result, the node N2 is not connected to the ground voltage source Vss until a high level signal from the third counter is applied to the gate of the NMOS transistor Q8. As a result, the voltage at the node N1 is inverted by the invertor 31 and applied to the gate of the NMOS transistor Q12 in the burst signal generation circuit 40, thereby causing the NMOS transistor Q12 to be turned off.

On the other hand, at the moment that the count signal cnt_3 from the third counter is on a high level, the node N2 is connected to the ground voltage source Vss, thereby causing the comparison circuit 30 to supply a high level pulse signal or the burst end signal burst_end, as shown in (E) of FIG. 2, to the gate of the NMOS transistor Q12 in the burst signal generation circuit 40. At this time, the burst end signal burst_end has the same pulse width as that of the clock signal. In this manner, as shown in (F) of FIG. 2, the burst signal generation circuit 40 generates the burst mode signal burst_sig of high level from the application of the external burst command signal cmd_sig from the input line 2 until the application of the burst end signal burst_end from the comparison circuit 30 for turning on the NMOS transistor Q12.

As a result, an external address signal is applied as an initial value to an internal address generation circuit (not shown) and an output signal from the internal address generation circuit is decoded so that the burst mode can be maintained until four reading or writing operations are performed.

However, the above-mentioned conventional burst length detection circuit is disadvantageous in that it increases the chip area and causes power consumption in operation, because it comprises a counting circuit for the burst length detection and a counting circuit for the internal address generation.

SUMMARY OF THE INVENTION

Therefore, the present invention has been made in view of the above problem, and it is an objective of the present invention to provide a burst length detection circuit which is capable of detecting a burst end time point with no use of a burst length detection counter, thereby reducing the chip area and power consumption.

In accordance with the present invention, the above and other objectives can be accomplished by a provision of a burst length detection circuit comprising at least two storage means, each of the storage means storing a corresponding one of at least two external address signals therein; at least two internal address signal generation means, each of the internal address signal generation means inputting a corresponding one of at least two external address signals as its initial value, and sequentially incrementing it by one in response to a clock signal, to sequentially generate internal address signals; at least two comparison means, each of the comparison means being operated in response to a control signal to compare an output signal from a corresponding one of at least two internal address signal generation means with an output signal from a corresponding one of the at least two storage means; logic means for performing a logic operation with respect to output signals from at least two comparison means to detect a burst end time point; and burst signal generation means for generating a burst mode signal with a desired logic value in response to an external burst command signal and a burst end signal from the logic means.

BRIEF DESCRIPTION OF THE DRAWINGS

The above and other objectives, along with the features and advantages of the present invention, will be more clearly understood from the following detailed description taken in conjunction with the accompanying drawings, in which.

DETAILED DESCRIPTION OF THE PREFERRED EMBODIMENTS

Figure 1:
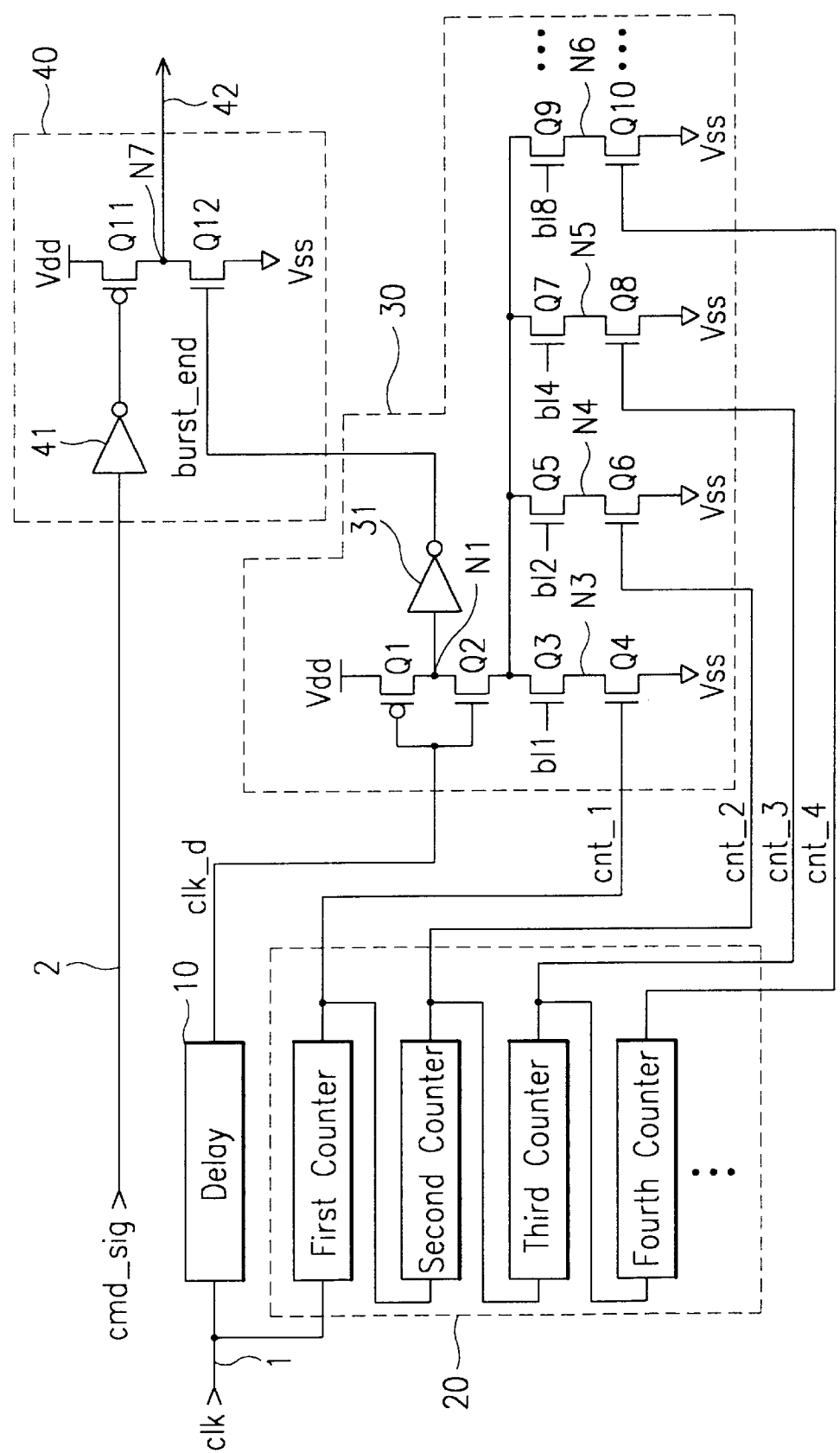
FIG. 1 is a circuit diagram illustrating the construction of a conventional burst length detection circuit.
Figure 2:
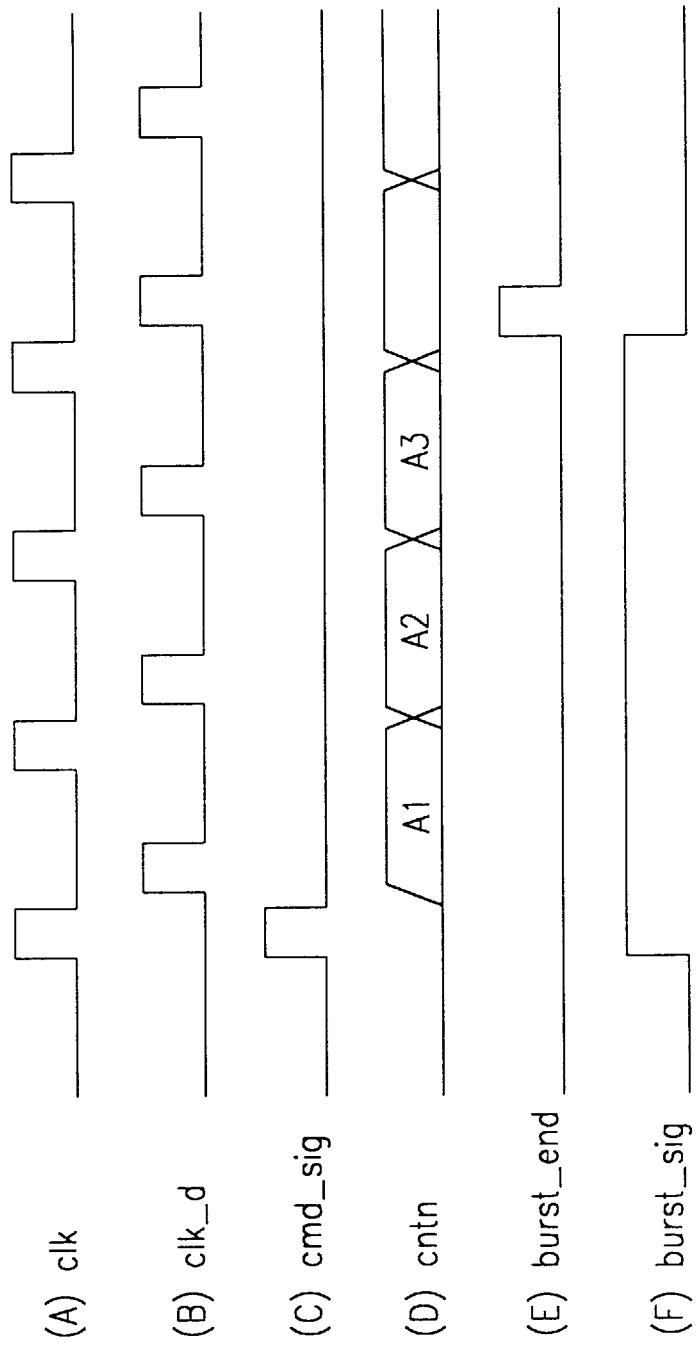
FIG. 2 is a timing diagram illustrating the operation of the conventional burst length detection circuit.
Figure 3:
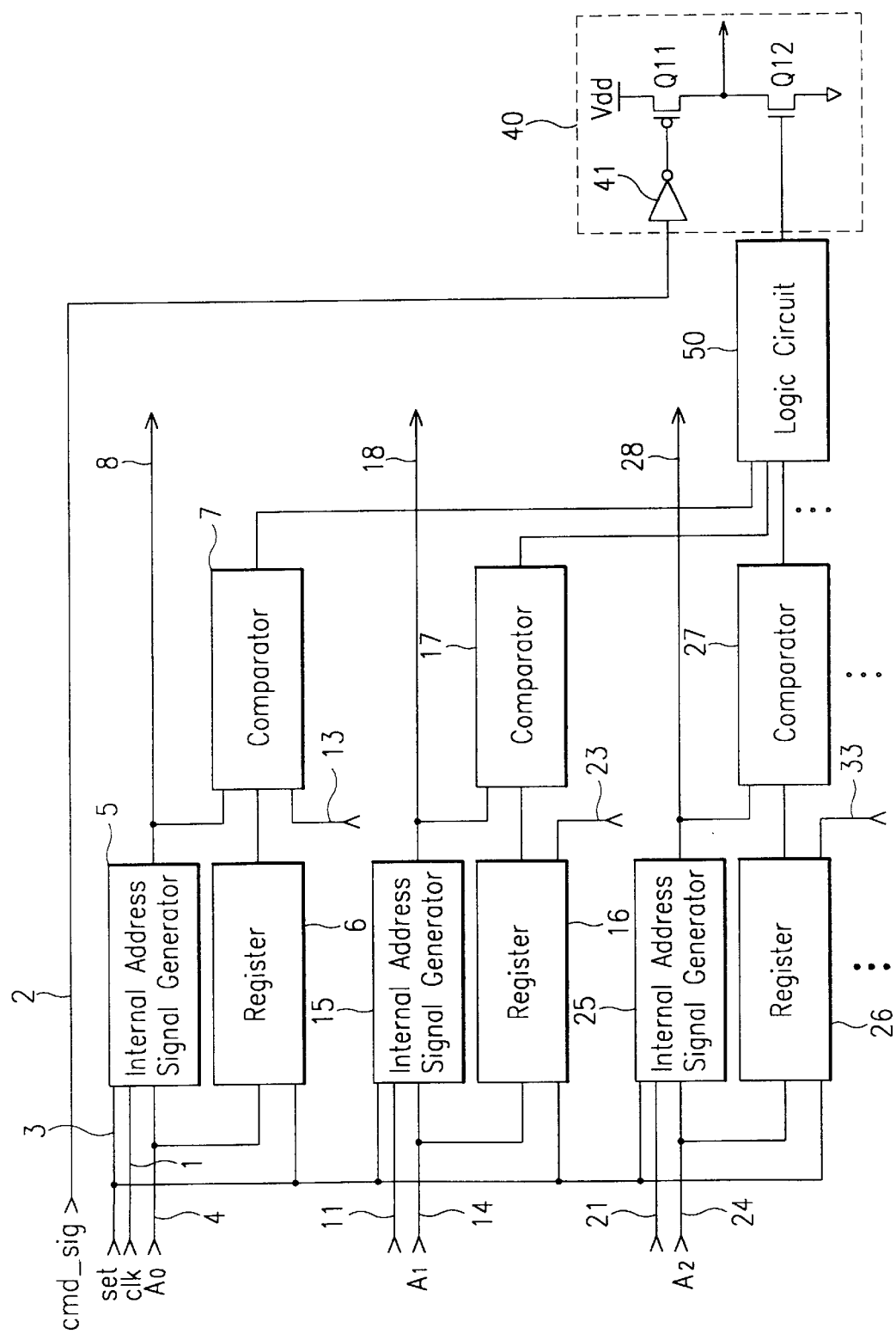
FIG. 3 is a block diagram illustrating the construction of a burst length detection circuit in accordance with the present invention.

Referring to FIG. 3, the construction of a burst length detection circuit in accordance with the present invention is shown in block form. Some parts in this drawing are the same as those in FIG. 1. Therefore, like reference numerals designate like parts.

As shown in FIG. 3, the burst length detection circuit comprises clock signal input lines 1, 11, 21, . . . for inputting externally different clock signals, respectively, address signal input lines 4, 14, 24, . . . for inputting external address signals $A_0, A_1, A_2, \ldots$, respectively, a first control line 3 for inputting an external control signal set, a first internal address signal generator 5 being operated in response to the control signal set from the first control line 3 for inputting the least significant bit address signal $A_0$ of the external address signals $A_0, A_1, A_2, \ldots$ from the address signal input lines 4, 14, 24, . . . as its initial value to generate internal address signals, a first register 6 connected to the first address input line 4 for storing the least significant bit address signal $A_0$ from the first address input line 4 therein for a predetermined time period in response to the control signal set from the first control line 3, a first comparator 7 for comparing output signals from the first internal address signal generator 5 and first register 6 with each other in response to a control signal from a second control line 13, and a first output line 8 for transferring the internal address signals from the first internal address signal generator 5 to a predecoder or decoder (not shown).

The burst length detection circuit further comprises internal address signal generators 15, 25, . . . which are the same in construction as the first internal address signal generator 5. Further, the burst length detection circuit comprises registers 16, 26, . . . which are the same in construction as the first register 6. Further, the burst length detection circuit comprises comparators 17, 27, . . . which are the same in construction as the first comparator 7.

Figure 8:
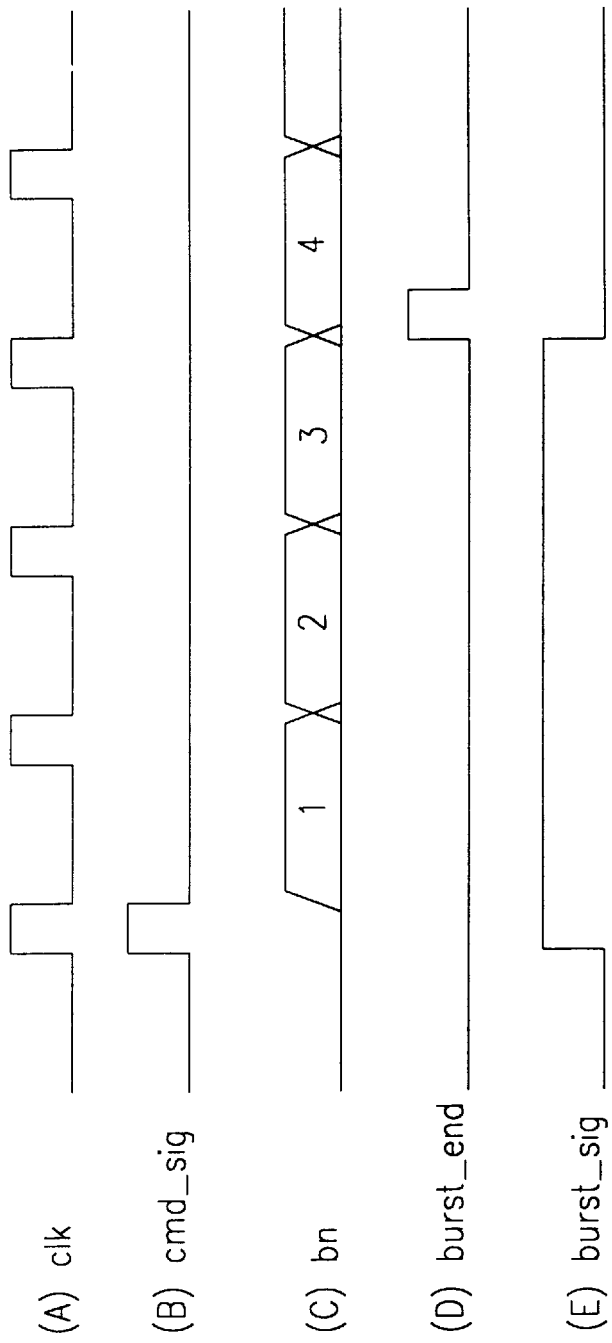
FIG. 8 is a timing diagram illustrating the operation of the burst length detection circuit in accordance with the present invention.

The burst length detection circuit further comprises a logic circuit 50 for performing an AND operation with respect to output signals from the comparators 7, 17, 27, . . . to generate a burst end signal burst_end as shown in (D) of FIG. 8, a burst signal generation circuit 40 for generating a burst mode signal burst_sig as shown in (E) of FIG. 8 in response to an external burst command signal cmd_sig from an input line 2 as shown in (B) of FIG. 8 and the burst end signal burst_end from the logic circuit 50 as shown in (D) of FIG. 8.

Figure 4:
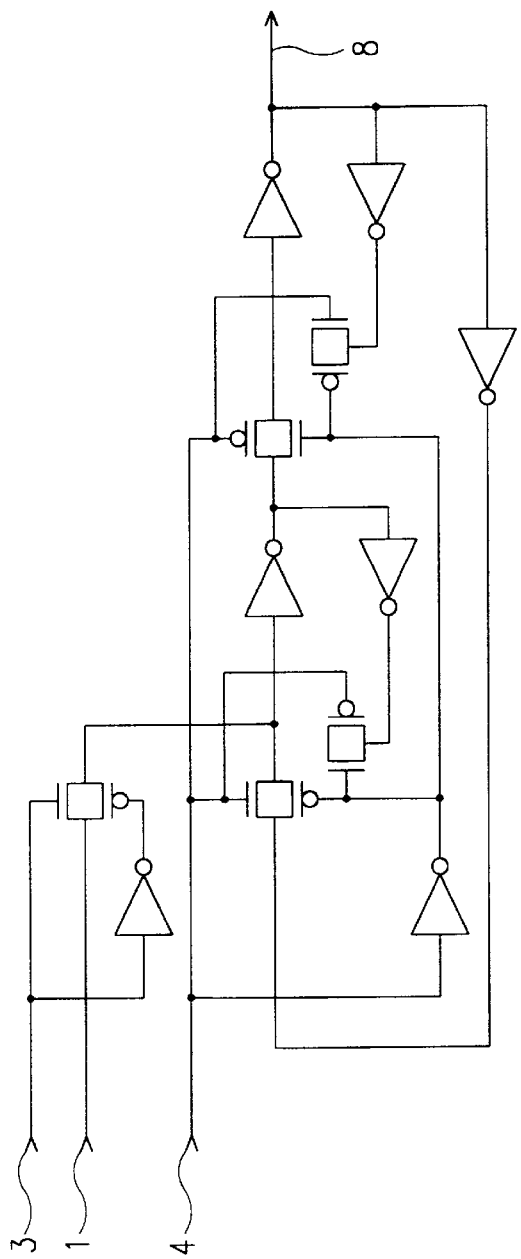
FIG. 4 is a detailed circuit diagram of a first internal address signal generator in FIG. 3.

Referring to FIG. 4, there is shown a detailed circuit diagram of the first internal address signal generator 5 in FIG. 3. The first internal address signal generator 5 is operated in response to the control signal set from the first control line 3 to input the external least significant bit address signal $A_0$ from the first address signal input line 4 as its initial value. Then, the first internal address signal generator 5 performs a counting operation for incrementing the externally least significant bit address signal $A_0$ by one, in response to the external clock signal clk from the first clock signal input line 1 to generate the internal address signals. The first internal address signal generator 5 is well known in the art, and thus, a detailed description thereof will be omitted. The remaining internal address signal generators 15, 25, . . . in FIG. 3 are constructed in the same manner as the first internal address signal generator 5.

Figure 5:
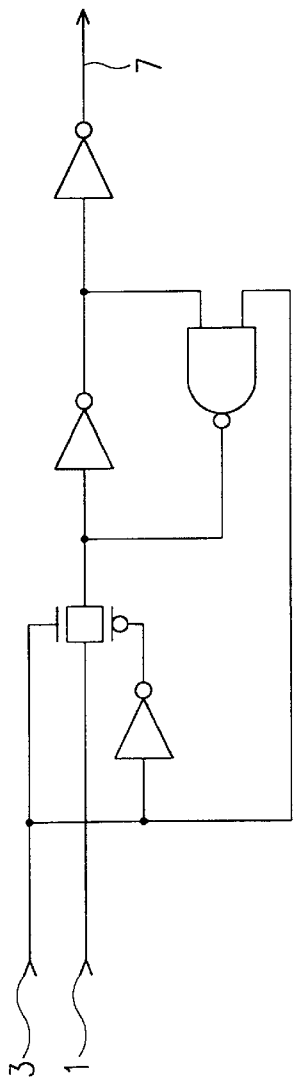
FIG. 5 is a detailed circuit diagram of a first register in FIG. 3.

Referring to FIG. 5, there is shown a detailed circuit diagram of the first register 6 in FIG. 3. The first register 6 is adapted to latch onto least significant bit address signal $A_0$ from the first address signal input line 4 for the predetermined time period in response to the control signal set from the first control line 3. The first register 6 is well known in the art, and thus, a detailed description thereof will be omitted. The remaining registers 16, 26, . . . in FIG. 3 are the same in construction as the first register 6.

Figure 6:
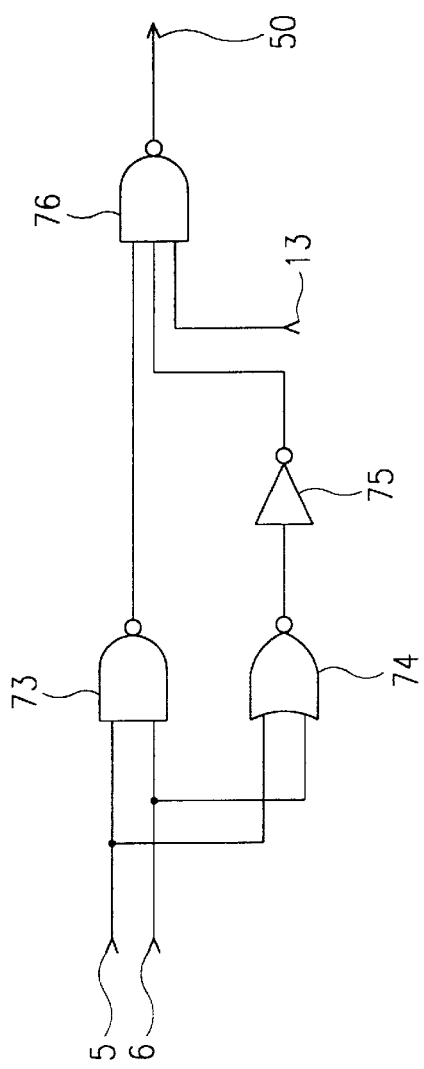
FIG. 6 is a detailed circuit diagram of a first comparator in FIG. 3.

Referring to FIG. 6, a detailed circuit diagram of the first comparator 7 in FIG. 3, is shown. The first comparator 7 includes a NAND gate 73 for inputting the output signals from the first internal address signal generator 5 and first register 6, a NOR gate 74 for inputting the output signals from the first internal address signal generator 5 and first register 6, an invertor 75 for inverting an output signal from the NOR gate 74, and a three-input NAND gate 76 for inputting an output signal from the NAND gate 73, an output signal from the invertor 75 and the control signal from the second control line 13. The remaining comparators 17, 27, . . . in FIG. 3 are the construction in the same manner as the first comparator 7, and thus, a description thereof will be omitted. The three-input NAND gate 76 is adapted to output a high level signal to the logic circuit 50 when the control signal from the second control line 13 is on a high level and the output signals from the first internal address signal generator 5 and first register 6 are on the same level.

The operation of the three-input NAND gate 76 based on the burst length will hereinafter be described in more detail.

For example, in a case where the burst length is 1, a control signal fixed to a low level is applied from the second control line 13 to the three-input NAND gate 76 in the first comparator 7, thereby always causing the first comparator 7 to output a high level signal to the logic circuit 50. As a result, because any internal address variation does not occur, the two-cycle operation, including the operation based on the external address signal, is performed.

In the case where the burst length is 4, a control signal fixed to a low level is applied from a fourth control line 33 to the three-input NAND gate 76 in the third comparator 27, thereby always causing the third comparator 27 to output a high level signal to the logic circuit 50. However, control signals fixed to their high levels are applied from the second and third control lines 13 and 23 to the three-input NAND gates 76 in the first and second comparators 7 and 17, respectively. As a result, the first comparator 7 outputs a high level signal to the logic circuit 50 when the output signals from the first internal address signal generator 5 and first register 6 are on the same level. Also, the second comparator 17 outputs a high level signal to the logic circuit 50 when the output signals from the second internal address signal generator 15 and second register 16 are on the same level. As a result, the three-cycle operation is performed.

Figure 7:
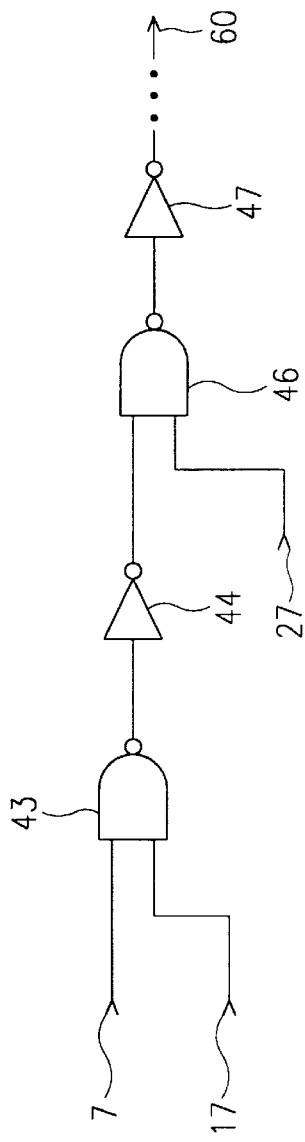
FIG. 7 is a detailed circuit diagram of a logic circuit in FIG. 3.

Referring to FIG. 7, a detailed circuit diagram of the logic circuit 50 in FIG. 3, is shown. Also shown in this drawing is the logic circuit 50, which includes a first NAND gate 43 for NANDing the output signals from the first and second comparators 7 and 17, and a first invertor 44 for inverting an output signal from the first NAND gate 43.

The logic circuit 50 further includes a second NAND gate 46 for NANDing an output signal from the first invertor 44 and the output signal from the third comparator 27, and a second invertor 47 for inverting an output signal from the second NAND gate 46. In this manner, the logic circuit 50 includes NAND gates and inverters of the number corresponding to that of comparators. In FIG. 7, when the output signals from the first to third comparators 7, 17 and 27 are all on a high level, the second inverter 47 generates the burst end signal burst_end of high level, indicating that the burst mode has been ended. The second invertor 47 then outputs the generated burst end signal burst_end to the burst signal generation circuit 40.

The operation of the burst length detection circuit with the above-mentioned construction in accordance with the present invention will hereinafter be described in more detail with reference to FIGS. 8A to 8E.

FIGS. 8, in accordance with the present invention, is a timing diagram illustrating the operation of the burst length detection circuit. For the convenience of description, assume that the burst length is 4. The external control signal set on a high level from the first control line 3 is applied simultaneously to the first to third internal address signal generators 5, 15 and 25. At this time, the control signal set from the first control line 3 has a narrow pulse width. Also, the external address signals $A_0$ and $A_1$ of high levels from the first and second address input lines 4 and 14 are applied to the first and second internal address signal generators 5 and 15, respectively. Further, the external address signal $A_2$ of low level from the third address input line 24, is applied to the third address signal generator 25.

The first internal address signal generator 5 inputs the address signal $A_0$ from the first address input line 4 as its initial value, and then, sequentially increments it by one in response to the external clock signal clk from the first clock signal input line 1, as shown in (A) of FIG. 8. As a result, the first internal address signal generator 5 sequentially generates the resultant first internal address signals $A_{0+1}$, $A_{0+2}$, . . . Then, the first internal address signal generator 5 supplies the generated first internal address signals to the first comparator 7 and the predecoder (not shown) through the first output line 8.

The second internal address signal generator 15 inputs the address signal $A_1$ from the second address input line 14 as its initial value, and then, sequentially increments it by one in response to the external clock signal from the second clock signal input line 11, which has twice as long a period of the external clock signal clk from the first clock signal input line 1, as shown in (A) of FIG. 8. As a result, the second internal address signal generator 15 sequentially generates the resultant second internal address signals $A_{1+1}$, $A_{1+2}$, . . . Then, the second internal address signal generator 15 supplies the generated second internal address signals to the second comparator 17 and the predecoder (not shown) through a second output line 18.

The third internal address signal generator 25 inputs the address signal $A_2$ from the third address input line 24 as its initial value, and then, sequentially increments it by one in response to the external clock signal from the third clock signal input line 21, which has four times as long a period of the external clock signal clk from the first clock signal input line 1, as shown in (A) of FIG. 8. As a result, the third internal address signal generator 25 sequentially generates the resultant third internal address signals $A_{2+1}$, $A_{2+2}$, . . . Then, the third internal address signal generator 25 supplies the generated third internal address signals to the third comparator 27 and the predecoder (not shown) through a third output line 28.

The first to third registers 6, 16 and 26 store the address signals $A_0$, $A_1$ and $A_2$ from the first to third address input lines 4, 14 and 24 therein, upon receiving the control signal, set on a high level from the first control line 3, respectively. Then, the first to third registers 6, 16 and 26 remain at their floated states.

Upon receiving the control signal on a high level from the second control line 13, the first comparator 7 outputs a high level signal to the logic circuit 50 when the output signals from the first internal address signal generator 5 and first register 6 are on the same level.

Also, upon receiving the control signal on a high level from the third control line 23, the second comparator 17 outputs a high level signal to the logic circuit 50 when the output signals from the second internal address signal generator 15 and second register 16 are on the same level.

The third comparator 27 is applied with the control signal on a low level, from the fourth control line 33. As a result, the third comparator 27 always outputs a high level signal to the logic circuit 50 regardless of logic levels of the output signals from the third internal address signal generator 25 and third register 26.

As a result, at the moment that the first and second comparators 7 and 17 output the high level signals, the logic circuit 50 generates the burst end signal burst_end of high level, as shown in (D) of FIG. 8, and supplies it to the burst signal generation circuit 40.

The burst signal generation circuit 40 generates the burst mode signal burst_sig of high level, as shown in (E) of FIG. 8, from the application of the external burst command signal cmd_sig from the input line 2 until the application of the burst end signal burst_end from the logic circuit 50 for turning on the NMOS transistor Q12. Therefore, the burst mode can be maintained until the four-cycle operation, including the operation based on the external address signal, is performed.

As is apparent from the above description, according to the present invention, the burst length detection circuit can detect the burst end time point without the use of a burst length detection counter. Therefore, the burst length detection circuit of the present invention has the effect of reducing the chip area and the power consumption.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A burst length detection circuit comprising:
   a) at least two storage means for storing different respective portions of an entire external address, the different respective portions collectively constituting the entire external address;
   b) at least two internal address signal generation means for inputting the different respective portions of the entire external address signals as respective initial values, and for sequentially incrementing the respective initial values by one in response to respective clock signals to sequentially generate respective internal address signals;
   c) at least two comparison means, operated in response to respective control signals, for comparing:
      1) respective output signals from respective internal address signal generation means with
      2) respective output signals from respective storage means;
   d) logic means for performing an AND logic operation on output signals from said at least two said comparison means to detect a burst end time point; and
   e) burst signal generation means for generating a burst mode signal with a desired logic value in response to an external burst command signal and a burst end signal from said logic means.

2. A burst length detection circuit as set forth in claim 1, wherein each of said at least two comparison means includes:
   a NAND gate for inputting the output signals from said respective internal address signal generation means and storage means;
   a NOR gate for inputting the output signals from said respective internal address signal generation means and storage means;
   an invertor for inverting an output signal from said NOR gate; and
   a three-input NAND gate for inputting an output signal from said NAND gate, an output signal from said invertor, and the respective control signal.

3. A burst length detection circuit as set forth in claim 1, wherein said logic means includes:
   a first AND gate that ANDs the output signals from two leading comparison means; and
   a second AND gate that ANDs (1) a signal responsive to an output signal from said first AND gate and (2) the output signal from a subsequent comparison means.

4. A burst length detection circuit as set forth in claim 1, wherein said burst signal generation means includes:
   an invertor for inverting the external burst command signal;
   a PMOS transistor connected between a supply voltage source and an output line, said PMOS transistor having a gate for inputting an output signal from said invertor; and
   an NMOS transistor connected between said output line and a ground voltage source, said NMOS transistor having a gate for inputting the burst end signal from said logic means.

* * * * *

UNITED STATES PATENT AND TRADEMARK OFFICE
CERTIFICATE OF CORRECTION

PATENT NO.    : 5,805,928
DATED         : September 8, 1998
INVENTOR(S)   : Jae Jin Lee It is certified that error appears in the above-identified patent and that said Letters Patent is hereby corrected as shown below:

IN THE DRAWINGS:
Sheet 3, Fig. 3 and as duplicated on the title page of the patent, input terminals 23 and 33 are changed to be respectively connected to comparators 17 and 27, rather than registers 16 and 26.

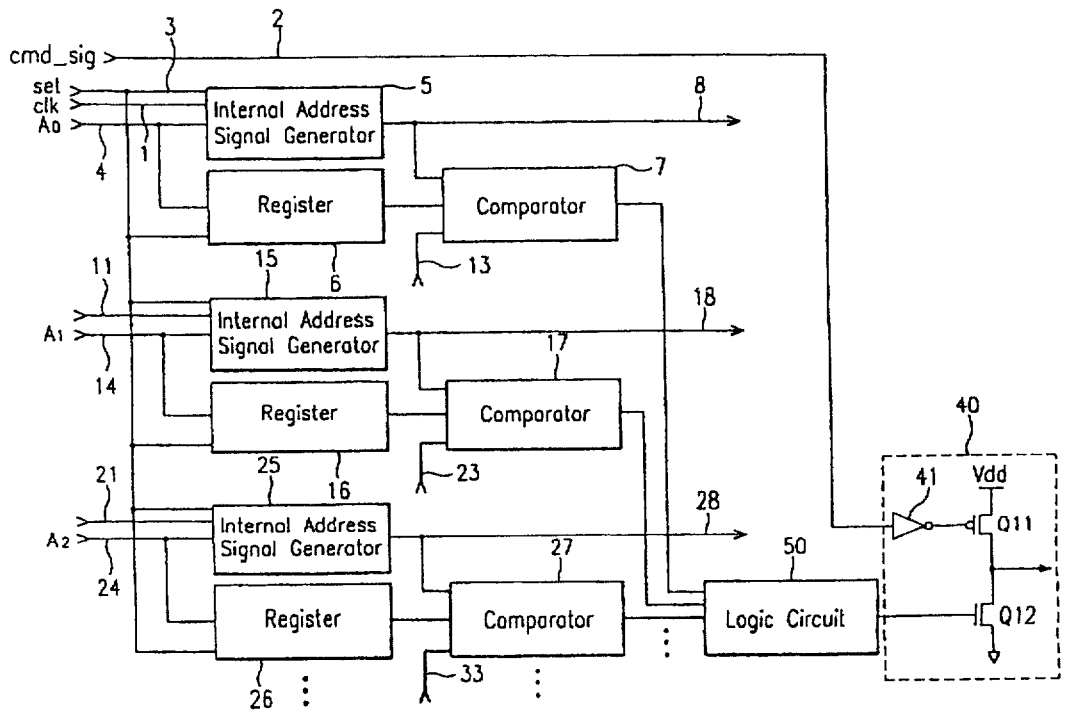

Fig.3

UNITED STATES PATENT AND TRADEMARK OFFICE
CERTIFICATE OF CORRECTION

PATENT NO. : 5,805,928
DATED : September 8, 1998
INVENTOR(S) : Jae Jin Lee

It is certified that error appears in the above-identified patent and that said Letters Patent is hereby corrected as shown below:

IN THE DRAWINGS: (Cont'd)
Sheet 4, Fig. 4, numeral "1" marking an input terminal is changed to -- 4 --; numeral "4" marking another input terminal is changed to -- 1 --; two electrical connections extending vertically are added to connect one side of each of two CMOS transmission gates to an input of a corresponding inverter, the two CMOS transmission gates are shown as receiving gate connections along the horizontal dimension.

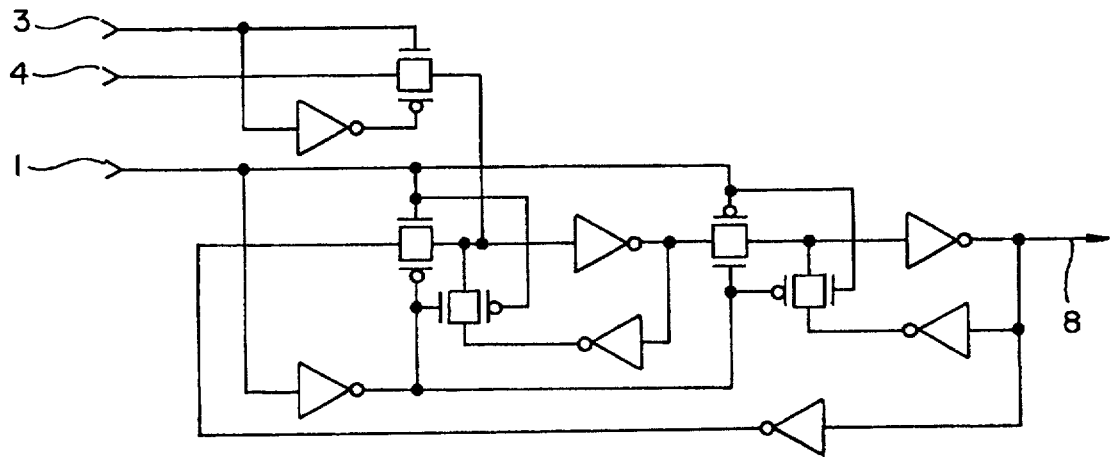

Fig. 4

UNITED STATES PATENT AND TRADEMARK OFFICE
CERTIFICATE OF CORRECTION

PATENT NO. : 5,805,928
DATED : September 8, 1998
INVENTOR(S) : Jae Jin Lee

It is certified that error appears in the above-identified patent and that said Letters Patent is hereby corrected as shown below:

IN THE DRAWINGS: (Cont'd)
Sheet 4, delete Fig. 5.

IN THE SPECIFICATION:

Column 4,
Lines 19-20, delete "FIG. 5 is a detailed circuit diagram of a first register in FIG. 3;";

Column 5,
Lines 27-28, delete "Referring to FIG 5, there is shown a detailed circuit diagram of the first register 6 in FIG. 3.".

Signed and Sealed this

Twenty-first Day of August, 2001

*Nicholas P. Godici*

Attest:

NICHOLAS P. GODICI
*Attesting Officer*    *Acting Director of the United States Patent and Trademark Office*